United States Patent [19]
Yamaguchi et al.

[11] Patent Number: 6,129,982
[45] Date of Patent: Oct. 10, 2000

[54] AROMATIC POLYIMIDE FILM HAVING IMPROVED ADHESION

[75] Inventors: Hiroaki Yamaguchi; Hideki Ozawa, both of Chiba; Hideharu Watakabe; Toshihiko Anno, both of Yamaguchi, all of Japan

[73] Assignee: Ube Industries, Ltd., Yamaguchi, Japan

[21] Appl. No.: 09/055,738

[22] Filed: Apr. 6, 1998

[30] Foreign Application Priority Data

Nov. 28, 1997 [JP] Japan ................................ 9-328460
Dec. 26, 1997 [JP] Japan ................................ 9-359792

[51] Int. Cl.[7] .............................. B32B 7/04; B32B 15/08; B32B 27/34; C08G 73/10
[52] U.S. Cl. ..................... 428/336; 428/458; 428/473.5; 524/301; 524/399; 524/430; 524/437; 524/441; 528/180; 528/319
[58] Field of Search .................... 428/336, 458, 428/473.5; 524/399, 430, 437, 441, 301; 528/180, 319

[56] References Cited

U.S. PATENT DOCUMENTS 4,839,217 6/1989 Tabata et al. ......................... 428/156

*Primary Examiner*—D. S. Nakarani
*Attorney, Agent, or Firm*—Reed Smith Shaw & McClay LLP

[57] ABSTRACT

In a heat-resistant aromatic polyimide/metal (or metal oxide) composite sheet composed of an aromatic polyimide film and a metal or metal oxide layer arranged on the film, the polyimide film is composed of an aromatic polyimide resin and an Al-containing material dispersed in the polyimide resin in an amount of 1 to 1,000 ppm per the amount of polyimide film, and the metal or metal oxide layer is formed on the polyimide film via no adhesive.

20 Claims, 1 Drawing Sheet

AROMATIC POLYIMIDE FILM HAVING IMPROVED ADHESION

FIELD OF THE INVENTION

The present invention relates to an aromatic polyimide film having improved adhesion and further relates to an aromatic polyimide/metal(or metal oxide) composite sheet.

BACKGROUND OF THE INVENTION

An aromatic polyimide film shows a high heat resistance as well as good electric characteristics, and are widely employed as material for producing electronic devices. The aromatic polyimide film, however, has such a disadvantageous feature as poor adhesive property to an adhesive ordinarily employed for constituting electronic devices. Further, a metal film deposited on the aromatic polyimide film by sputtering shows poor adhesion to the polyimide film and is easily peeled off from the polyimide film. Therefore, studies for improving the poor adhesive property of an aromatic polyimide film have been made and reported.

U.S. Pat. No. 5,218,034 describes a polyimide film having improved adhesion and thermal durability containing from 0.02 to 1% by weight of tin based on the weight of the film.

U.S. Pat. No. 5,543,222 describes a vacuum metallized polyimide film comprising an aromatic polyimide layer containing a hydrocarbyl tin compound in oxidation states (II) or (IV) as an additive and metal plated layer bonded integrally with a high bonding strength or high adhesion through a vacuum deposited metal layer without the use of an adhesive.

U.S. Pat. No. 5,272,194 describes a strengthened polyimide film having improved adhesion when bonded to a metal foil through a heat-resistant adhesive, containing from 0.02 to 1% by weight, based on the weight of the film, of an organo-metallic compound wherein the metal is tin, bismuth or antimony.

U.S. Pat. No. 5,227,244 describes a polyimide film having improved adhesion prepared by coating the surface of a partially cured or partially dried polyamide acid film with an organic solvent solution of a metal salt and heating the coated film to both convert the polyamide acid to polyimide and dry the film. The metal salt is a salt of Sn, Zn, Cu, Fe, Co, Mn, or Pd.

Japanese Patent Provisional Publications 59-86634 and H2-134241 describe that a polyimide film can be improved in its adhesion by plasma discharge processing.

Japanese Patent Provisional Publication H1-214840 describes a process for preparing a polyimide pattern which comprises the steps of forming a film of an aluminum alcoholate or an aluminum chelate compound on a film of polyimide or its precursor, coating a photoresist on the aluminum-compound layer, imagewise exposing the photoresist coat to light, and etching the light-exposed photoresist.

SUMMARY OF THE INVENTION

It is a main object of the present invention to provide a new aromatic polyimide film showing improved adhesion and low electro-conductivity.

It is another object of the invention to provide a composite sheet comprising an aromatic polyimide layer and a metal or metal oxide layer, in which the composite sheet has a high bonding strength between the polyimide layer and the metal or metal oxide layer and the polyimide layer shows low electro-conductivity.

The present invention resides in an aromatic polyimide film comprising an aromatic polyimide resin and an aluminum-containing material dispersed in the polyimide resin in an amount of 1 to 1,000 ppm (in terms of the amount of aluminum element) per the amount of the polyimide film.

The invention further resides in an aromatic polyimide composite sheet comprising an aromatic polyimide film and a metal or metal oxide layer arranged on one or both surfaces of the film in which the polyimide film comprises an aromatic polyimide resin and an aluminum-containing material dispersed in the polyimide resin in an amount of 1 to 1,000 ppm (in terms of the amount of aluminum element) based on the amount of the polyimide film, and the metal or metal oxide layer is formed on the film via no adhesive.

DETAILED DESCRIPTION OF THE INVENTION

Figure 1:
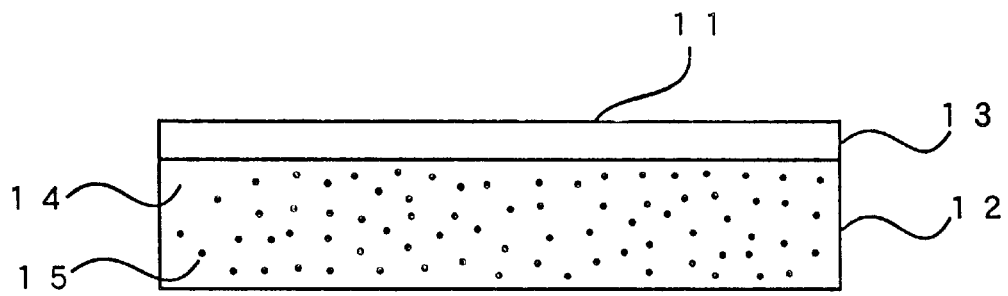
FIG. 1 is a schematic section of a representative composite sheet of the invention.

A representative composite sheet of the invention is illustrated in FIG. 1, in which the composite sheet 11 is composed of an aromatic polyimide film 12 and a metal or metal oxide layer 13 provided on the polyimide film 12. The polyimide film 12 comprises an aromatic polyimide phase 14 and an aluminum-containing material 15 which is dispersed in the polyimide phase 14. The metal or metal oxide layer 13 is formed on the polyimide film 12 generally by sputtering, vacuum deposition, or electron beam deposition and is firmly bonded to the polyimide film 12.

Figure 2:
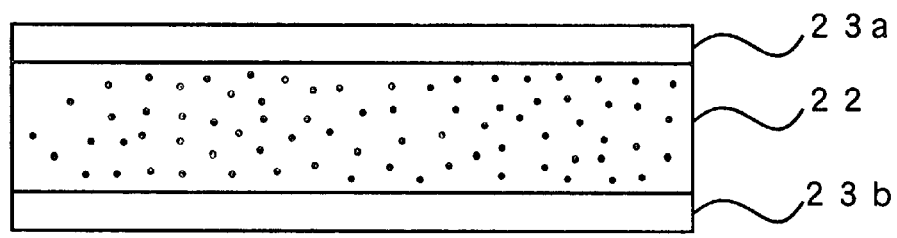
FIG. 2 is a schematic section of another representative composite sheet of the invention.

In the composite sheet of the invention, the metal or metal oxide layer can be placed on both sides of the polyimide film. FIG. 2 shows a typical structure of the composite sheet in which a metal or metal oxide layer 23a, 23b is placed on both sides of the polyimide film 22.

Figure 3:
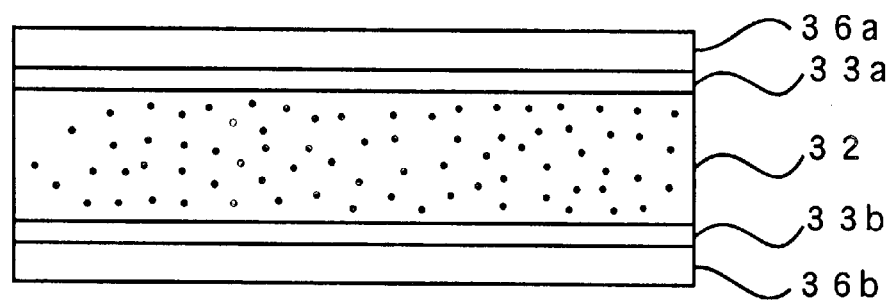
FIG. 3 is a schematic section of a further representative composite sheet of the invention.

The composite sheet of the invention can comprise a metal film, a metal or metal oxide layer, an aromatic polyimide film, a metal or metal oxide layer, and a metal film, placed in order. FIG. 3 indicates a typical structure of the composite sheet of this type, in which a metal or metal oxide layer 33a, 33b, and a metal film 36a, 36b are placed on both sides of an aromatic polyimide film 32.

The polyimide film of the invention comprises an aromatic polyimide resin and an aluminum-containing material dispersed in the polyimide resin in an amount of 1 to 1,000 ppm, preferably 4 to 1,000 ppm, based on the amount of the polyimide film.

The polyimide film of the invention comprises a resin matrix of an aromatic polyimide resin. The aromatic polyimide resin is preferably composed of an aromatic tetracarboxylic acid residue and an aromatic diamine residue. The aromatic tetracarboxylic acid residue is preferably derived from an aromatic tetracarboxylic dianhydride, and the aromatic diamine residue is preferably derived from an aromatic diamine. A small portion of the aromatic tetracarboxylic acid residue can be an aliphatic tetracarboxylic acid residue, and a small portion of the aromatic diamine residue can be an aliphatic diamine. The polyimide resin can contain an aminodicarboxylic acid residue such as 4-aminophthalic acid residue, 4-amino-5-methylphthalic acid residue, or 4-(3,3'-dimethyl-4-anilino)phathalic acid residue, in addition to the aromatic tetracarboxylic acid residue and the aromatic diamine residue.

Examples of the aromatic tetracarboxylic acid dianhydrides include 3,4,3',4'-biphenyltetracarboxylic dianhydride (hereinafter, referred to as s-BPDA), pyromellitic dianhydride, benzophenonetetracarboxylic dianhydride, and bis(3,4-dicarboxyphenyl)ether dianhydride (i.e., oxydiphthalic dianhydride).

Examples of the an aromatic diamines include p-phenylene diamine and 4,4'-diaminodiphenyl ether. A portion of the aromatic diamine can be replaced with an aromatic diamine having plural benzene rings and a flexible structure such as 4,4'-diaminodiphenylsulfide, 4,4'-diaminobenzophenone, 4,4'-diaminodiphenylmethane, 2,2-bis(4-aminophenyl)propane, 1,4-bis(4-aminophenoxy)benzene, 4,4'-bis(4-aminophenyl)diphenyl ether, 4,4'-bis(4-aminophenyl)diphenylsulfone, 4,4'-bis(4-aminophenyl)diphenylsulfide, 4,4'-bis(4-aminophenyl)diphenylmethane, 4,4'-bis(4-aminophenoxy)diphenyl ether, 4,4'-bis(4-aminophenoxy)diphenylsulfone, 4,4'-bis(4-aminophenoxy)diphenylsulfide, 4,4'-bis(4-aminophenoxy)diphenylmethane, 2,2-bis[4-(aminophenoxy)phenyl]propane, or 2,2-bis[4-(4-aminophenoxy)phenyl]hexafluoropropane, an aliphatic diamine such as 1,4-diaminobutane, 1,6-diaminohexane, 1,8-diaminooctane, 1,10-diaminodecane, or 1,12-diaminododecane, and other aromatic diamines such as xylylenediamine.

The aromatic polyimide resin preferably has a low linear expansion coefficient such as that in the range of $0.5 \times 10^{-5}$ to $2.5 \times 10^{-5}$ cm/cm/° C., more preferably, $1 \times 10^{-5}$ to $2 \times 10^{-5}$ cm/cm/° C., in the temperature range of 50 to 250° C. The aromatic polyimide resin having such low linear expansion coefficient can be prepared from a combination of 3,3',4,4'-biphenyltetracarboxylic dianhydride and p-phenylene diamine, a combination of a mixed aromatic tetracarboxylic acid components such as a mixture of pyromellitic dianhydride, 3,3',4,4'-biphenyltetracarboxylic dianhydride and benzophenonetetracarboxylic dianhydride, and p-phenylene diamine (hereinafter referred to as PPD) alone or a mixed diamine components such as a mixture of PPD and 4,4'-diaminodiphenyl ether (hereinafter referred to as DADE). PPD and DADE are preferably employed in a molar ratio of 100/0 to 15/85 (PPD/DADE). The polyimide can be in any form of a homopolymer, a random copolymer and a block copolymer. The polyimide can also be prepared by separately producing two or more kinds of polyamide acids, mixing these polyamide acids, and heating the mixed polyamide acids to give a polyimide film.

The polyimide film can be prepared by reacting in an organic solvent the aromatic tetracarboxylic acid component and the aromatic diamine component in approximately equimolar ratio at a temperature of lower than approximately 100° C., preferably 20 to 60° C., to give a polyamide acid solution (in which a portion of the polyamide acid may be already converted into a polyimide), and the polyamide acid solution (dope solution) is casted on an appropriate support and heated to a temperature of 70 to 200° C. to give a dry film. The dry film is then separated from the support and heated to a temperature of higher than 420° C., preferably a temperature of 430 to 520° C., preferably for 2 to 30 min., to convert the polyamide acid to a polyimide. Thus prepared polyimide film preferably has a thickness of 25 to 125 µm, more preferably 45 to 125 µm.

The organic solvent employed for the preparation of the polyamide acid can be N-methyl-2-pyrrolidone, N,N-dimethylformamide, N,N-dimethyacetamide, N,N-diethylacetamide, dimethylsulfoxide, hexamethylphosphoramide, or N-methylcaprolactam. These organic solvents can be employed singly or in combination. In the reaction solution, an organic base compound such as imidazole, 2-methylimidazole, 1,2-dimethylimidazole, 2-phenylimidazole, or triethylamine can be incorporated so as to accelerate the desired imidation. The organic base compound can be incorporated into the reaction solution in an amount of 0.1 to 10 weight %, based on the solid content of the solution. In the reaction solution, an organic phosphorus compound such as triphenyl phosphite, triphenyl phosphate, or alkyl phosphate can be also incorporated in an amount of 0.05 to 1 weight % (based on the amount of solid content) so as to facilitate the separation of the dry polyamide acid film from the support.

The polyimide resin can be a heat-resistant polyamide-imide resin.

The polyimide film of the invention contains therein an aluminum-containing material such as aluminum oxide. The aluminum-containing material can be incorporated into the polyimide film by mixing an aluminum compound with the polyamide acid solution or coating a solution of an aluminum compound on a wet or dry film of the polyamide acid solution and then heating the polyamide acid and the aluminum compound together to prepare a polyimide film containing therein an aluminum-containing material which is given by thermal conversion of the aluminum compound.

The aluminum compound is preferably soluble in the polyamide acid solution. Examples of the aluminum compounds include aluminum hydroxide or organic aluminum compounds such as aluminum monoethylacetate diisopropylate, aluminum diethylacetate monoisopropylate, aluminum triacetylacetonate, aluminum triethyl acetonate, aluminum isopropylate, and aluminum butyrate. The most preferred organic aluminum compound is aluminum triacetylacetonate. When the solution of aluminum compound is coated on the polyamide acid film, the solution is preferably prepared by dissolving the aluminum compound in a solvent such as an alcohol, an aromatic hydrocarbon, an aliphatic hydrocarbon, an alicyclic hydrocarbon, a ketone solvent, an ether solvent, or an amide solvent. In the solution, the aluminum compound is preferably contained in an amount of 0.01 to 5 weight %, more preferably 0.02 to 5 weight %.

The aluminum compound is heated to an elevated temperature such as a temperature of higher than 420° C. in the polyamide acid film in the imidation reaction. Therefore, most of the aluminum compound is turned into aluminum-containing material such as aluminum oxide. In the resulting polyimide film, the aluminum-containing material is contained in an amount (in terms of the amount of its aluminum element) of 1 to 1,000 ppm, preferably 4 to 1,000 ppm. If the content of aluminum element is less than 1 ppm, satisfactory improvement of adhesion cannot be expected, while if the content of aluminum element is higher than 1,000 ppm, the physical strength of the polyimide film lowers and the adhesion is not satisfactory.

On the polyimide film containing therein the aluminum-containing material, a metal layer or metal oxide layer is placed. The metal layer or metal oxide layer can be formed on the polyimide film using no adhesive, for instance, by vacuum deposition, ion-beam deposition, sputtering, or plating. When the deposition method is employed, the deposition is preferably performed under the conditions of $10^{-7}$ to $10^{-2}$ Torr, a deposition rate of 50 to 5,000 A/sec, and a temperature (i.e., film temperature) of 20 to 600° C. The sputtering is preferably performed by RF magnet sputtering under the conditions of less than 1 Torr, preferably $10^{-3}$ to $10^{-2}$ Torr, a temperature of 200 to 450° C., and a deposition rate for the layer formation of 0.5 to 500 A/sec.

The metal layer or metal oxide layer preferably comprises copper, copper alloy, aluminum, tin, tin alloy, or palladium, or its oxide. The metal layer or metal oxide layer can comprise a subbing layer of chromium, titanium, or palladium and a surface layer of copper.

The metal layer or metal oxide layer generally has a thickness of not more than 2 μm, preferably not more than 1 μm, more preferably 0.01 to 1.0 μm.

On the metal layer or metal oxide layer on the polyimide layer can be placed a metal film by plating. The metal film to be plated preferably comprises copper, copper alloy, or silver. The metal plating can be performed by electrolytic process or non-electrolytic process. The plated metal film preferably has a thickness of 1 to 40 μm.

The polyimide film having the metal layer or metal oxide layer on its surface shows a high heat-resistance and a high mechanical strength, and it receives a metal a film on its metal or metal oxide layer and keep it with high bonding strength. Therefore, the polyimide film having the metal layer or metal oxide layer on its surface according to the invention can be favorably employed as material for the preparation of electronic devices such as MCM (Multi Chip Module) and FPC (Flexible Printed Circuit Board).

The present invention is further described by the following Examples.

EXAMPLES 1 TO 2

(1) Dope Solution for Preparing Film

In 300 mL-volume glass reaction vessel equipped with a stirrer, a nitrogen gas-inlet tube and a reflux condenser, 183 g of N,N-dimethylacetamide and 0.1 g of a phosphoric acid compound (Separ 365-100, available from Chukyo Oil and Fat Co., Ltd.) were placed. The N,N-dimethylacetamide and the phosphoric acid compound were stirred in a nitrogen stream, and to the mixture was added 10.81 g (0.1000 mol.) of p-phenylenediamine. The resulting mixture was then warmed at 50° C. to give a homogeneous solution. To the solution was potionwise added 29.229 g (0.09935 mol.) of 3,3',4,4'-biphenyltetracarboxylic dianhydride, taking a care to obviate extreme heat generation. After the addition was complete, the reaction mixture was stirred at 50° C. for 5 hours. Subsequently, 0.2381 g (0.00065 mol.) of 3,3',4,4'-biphenyltetracarboxylic acid dihydrate was dissolved in the resulting solution. Thus, a viscous brown colored polyamide acid solution showing a viscosity of approximately 1,500 poise (at 25° C.) was prepared.

(2) Preparation of Polyimide Film

The polyamide acid solution obtained in (1) above was spread on a glass plate and heated to 150° C. for 10 min. to dryness. The dried polyamide acid film was separated from the glass plate and fixed on a frame. On the fixed polyamide acid film was coated an aluminum triacetyl acetonate solution (in toluene) having a concentration set forth in Table 1. The film was then heated at 200° C. for 3 min., 300° C. for 3 min., and 480° C. for 4 min., sequentially, to give a polyimide film having a thickness of 50 μm and showing a linear expansion coefficient of $1.5 \times 10^{-5}$ cm/cm/° C. at a temperature range of 50 to 250° C. The linear expansion coefficient was measured at a temperature elevation rate of 10° C./min.

(3) Preparation of Composite Sheet

The polyimide film was cleaned on its surfaced, and on the cleaned surface was formed a copper layer of 0.2 μm thick by electron beam deposition under the following conditions:

Film temperature: 150° C.

Pressure: lower than $2 \times 10^{-4}$ Pa

Copper purity: 4N

Deposition rate: 10–25 A/sec.

On the deposited copper film was plated a copper film of 10 μm thick by electrolytic plating, to give a composite sheet.

EXAMPLE 3

In the polyamide acid solution prepared in the same manner as in Examples 1 to 2, aluminum hydroxide in an amount set forth in Table 1 was dissolved, to give a homogeneous dope solution. The dope solution was spread on a glass plate and heated to 150° C. for 10 min. to dryness. The dried polyamide acid film was separated from the glass plate and fixed on a frame. The film was then heated at 200° C. for 3 min., 300° C. for 3 min., and 480° C. for 4 min., sequentially, to give a polyimide film having a thickness of 50 μm.

The polyimide film was then treated in the same manner as in Examples 1 to 2 to give a composite sheet.

EXAMPLES 4 TO 5

A dry polyamide acid film was prepared on a glass plate in the same manner as in Examples 1 to 2. The dry polyamide acid film was separated from the glass plate and fixed on a frame. On the fixed polyamide acid film was coated a solution of an aluminum chelate compound (ALCH, available from Kawaken Fine Chemical Co., Ltd., in dimethylacetamide) having a concentration set forth in Table 1. The film was then heated at 200° C. for 3 min., 300° C. for 3 min., and 480° C. for 4 min., sequentially, to give a polyimide film having a thickness of 50 μm.

The polyimide film was then treated in the same manner as in Examples 1 to 2 to give a composite sheet.

EXAMPLE 6

In the polyamide acid solution prepared in the same manner as in Examples 1 to 2, aluminum hydroxide in an amount set forth in Table 1 was dissolved, to give a homogeneous dope solution. The dope solution was spread on a glass plate and heated to 150° C. for 10 min. to dryness. The dried polyamide acid film was separated from the glass plate and fixed on a frame. On the fixed polyamide acid film was coated an aluminum triacetyl acetonate solution (in toluene) having a concentration set forth in Table 1. The film was then heated at 200° C. for 3 min., 300° C. for 3 min., and 480° C. for 4 min., sequentially, to give a polyimide film having a thickness of 50 μm.

The polyimide film was then treated in the same manner as in Examples 1 to 2 to give a composite sheet.

EXAMPLE 7

A dry polyamide acid film was prepared on a glass plate in the same manner as in Examples 1 to 2. The dry polyamide acid film was separated from the glass plate and fixed on a frame. On the fixed polyamide acid film was coated a solution of an aluminum chelate compound (ALCH, available from Kawaken Fine Chemical Co., Ltd., in dimethylacetamide) having a concentration set forth in Table 1. The film was then heated at 200° C. for 3 min., 300° C. for 3 min., and 480° C. for 4 min., sequentially, to give a polyimide film having a thickness of 25 μm and showing a linear expansion coefficient of $1.2 \times 10^{-5}$ cm/cm/° C. at a temperature range of 50 to 250° C.

The polyimide film was then treated in the same manner as in Examples 1 to 2 to give a composite sheet.

COMPARISON EXAMPLE 1

The procedure for preparing a polyimide film which is described in Examples 1 to 2 was repeated except for omitting the coating of aluminum compound, and the resulting polyimide film of 50 μm thick was treated in the same manner as in Examples 1 to 2 to give a composite sheet.

Evaluation of Composite Sheet (1) The resulting composite sheet was analyzed for the aluminum content by ICP emission under the following conditions:

A specimen (approximately 1 g) was fired to give an ash, and the ash was dissolved in an acid. The solution was analyzed by an emission analyzer (UOP-1 MARK-2, available from Kyoto Koken Co., Ltd.)

(2) All of the polyimide films prepared in Examples and Comparison Example had a tensile strength, an extension, a flexing resistance, and an electric insulation at almost the same level as the known polyimide film prepared from a combination of s-BPDA and PPD.

TABLE 1

| Composite sheet | Film thickness (μm) | Al(OH)$_3$ (added) (ppm) | Al comp. (coated) (wt. %) | Al content (ppm) | Peel resistance (kg/cm) |
| --- | --- | --- | --- | --- | --- |
| Ex. 1 | 50 | — | 2 | 600 | 2.5 |
| Ex. 2 | 50 | — | 1.75 | 510 | 2.0 |
| Ex. 3 | 50 | 10 | — | 4 | 1.6 |
| Ex. 4 | 50 | — | 2 | 500 | 2.0 |
| Ex. 5 | 50 | — | 3 | 730 | 2.0 |
| Ex. 6 | 50 | 10 | 0.2 | 65 | 2.0 |
| Ex. 7 | 25 | — | 3.0 | 700 | 2.2 |
| Com. 1 | 50 | — | — | 0.1 | 0 |

Remarks:

1) The aluminum contents for Examples 1, 2, and 4–7 were measured on the surface on which the aluminum compound was coated. For Example 3, the aluminum content was measured on the surface which had been in contact with the glass plate.

2) For Examples 4 and 5, the coating of the aluminum compound solution was made by dipping the polyimide film into the aluminum compound solution.

3) The polyimide film and the coated metal layers of the composite sheet of Comparison Example 1 spontaneously separated from each other, when the composite sheet was dipped in 2N hydrochloric acid.

What is claimed is:

1. An aromatic polyimide film comprising an aromatic polyimide resin and an aluminum-containing material dispersed in the polyimide resin in an amount as aluminum element of 1 to 1,000 ppm, based on the amount of polyimide film, said aluminum containing material being dispersed in the polyimide resin by heating a film prepared from an aromatic polyamide acid solution containing an aluminum-containing compound soluble in the aromatic polyamide acid solution to a temperature of higher than 420° C.

2. The aromatic polyimide film of claim 1, wherein the polyimide resin is composed of an aromatic tetracarboxylic acid residue and an aromatic diamine residue.

3. The aromatic polyimide film of claim 1, wherein the aluminum-containing compound is aluminum hydroxide or an organic aluminum compound.

4. The aromatic polyimide film of claim 1, wherein the aluminum-containing compound is an organic aluminum compound selected from the group consisting of aluminum monoethylacetate diisopropylate, aluminum diethylacetate monoisopropylate, aluminum triacetylacetonate, aluminum triethyl acetonate, aluminum isopropylate, and aluminum butyrate.

5. The aromatic polyimide film of claim 1, wherein the aluminum-containing material comprises aluminum oxide.

6. An aromatic polyimide composite sheet comprising an aromatic polyimide film and a metal or metal oxide layer arranged on one or both surfaces of the film in which the polyimide film comprises an aromatic polyimide resin and an aluminum-containing material dispersed in the polyimide resin in an amount as aluminum element of 1 to 1,000 ppm based on the amount of the polyimide film, said aluminum-containing material being dispersed in the polyimide resin by heating a film prepared from an aromatic polyamide acid solution containing an aluminum-containing compound soluble in the aromatic polyamide acid solution to a temperature of higher than 420° C., and the metal or metal oxide layer is formed on the film via no adhesive.

7. The aromatic polyimide composite sheet of claim 6, wherein the polyimide resin is composed of an aromatic tetracarboxylic acid residue and an aromatic diamine residue.

8. The aromatic polyimide composite sheet of claim 6, wherein the metal or metal oxide layer is formed on the polyimide film by vapor deposition, ion beam deposition, or sputtering.

9. The aromatic polyimide composite sheet of claim 6, wherein the metal or metal oxide layer has a thickness in the range of 0.01 to 1.0 μm.

10. The aromatic polyimide composite sheet of claim 7, wherein the aluminum-containing compound is aluminum hydroxide or an-organic aluminum compound.

11. The aromatic polyimide composite sheet of claim 6, wherein the aluminum-containing compound is an organic aluminum compound selected from the group consisting of aluminum monoethylacetate diisopropylate, aluminum diethylacetate monoisopropylate, aluminum triacetylacetonate, aluminum triethyl acetonate, aluminum isopropylate, and aluminum butyrate.

12. The aromatic polyimide composite sheet of claim 6, wherein the aluminum-containing material comprises aluminum oxide.

13. The aromatic polyimide composite sheet of claim 6, wherein the metal or metal oxide layer has a metal film electrolytically or non-electrolytically deposited thereon.

14. An aromatic polyimide film containing an aluminum-containing material in an amount as aluminum element of 1 to 1,000 ppm, and comprising an aromatic polyimide core film and a coat of aluminum-containing material placed on the aromatic polyimide core film.

15. The aromatic polyimide film of claim 14, wherein the aromatic polyimide core film contains essentially no aluminum-containing material.

16. The aromatic polyimide film of claim 14, which is prepared by heating an aromatic polyamide acid film coated at least on one side with an aluminum-containing compound soluble in and organic solvent to a temperature of higher than 420° C.

17. The aromatic polyimide film of claim 16, wherein the aromatic polyamide acid film contains essentially no aluminum-containing compound.

18. The aromatic polyimide film of claim 16, wherein the aluminum-containing compound is an organic aluminum compound.

19. An aromatic polyimide composite sheet comprising an aromatic polyimide film and a metal or metal oxide layer arranged on one or both surfaces of the film in which the aromatic polyimide film contains an aluminum-containing material in an amount as aluminum element of 1 to 1,000 ppm, and comprises an aromatic polyimide core film and a coat of an aluminum-containing material placed on the core film.

20. The aromatic polyimide composite sheet of claim 19, wherein the aromatic polyimide film is prepared by heating an aromatic polyamide acid film coated at least on one side with an aluminum-containing compound soluble in an organic solvent to a temperature of higher than 420° C.

* * * * *